(12) United States Patent
Buzi et al.

(10) Patent No.: US 12,740,336 B2
(45) Date of Patent: Sep. 15, 2026

(54) BORON SURFACE PASSIVATION OF PHASE CHANGE MEMORY MATERIAL

(71) Applicant: International Business Machines Corporation, Armonk, NY (US)

(72) Inventors: Luxherta Buzi, Chappaqua, NY (US); Robert L. Bruce, White Plains, NY (US); Charlie Tabachnick, Astoria, NY (US); Marinus Johannes Petrus Hopstaken, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 17/948,951

(22) Filed: Sep. 20, 2022

(65) Prior Publication Data

US 2024/0099166 A1 Mar. 21, 2024

(51) Int. Cl.
*H10N 70/00* (2023.01)
*H10B 63/00* (2023.01)
*H10N 70/20* (2023.01)

(52) U.S. Cl.
CPC ........... *H10N 70/801* (2023.02); *H10B 63/24* (2023.02); *H10B 63/80* (2023.02); *H10N 70/063* (2023.02); *H10N 70/231* (2023.02); *H10N 70/8825* (2023.02); *H10N 70/8828* (2023.02)

(58) Field of Classification Search
CPC ............... H10N 70/801; H10N 70/231; H10N 70/8828; H10N 70/882; H10B 63/24
See application file for complete search history.

(56) References Cited

U.S. PATENT DOCUMENTS

| | | | | |
|---|---|---|---|---|
| 6,429,064 | B1 | 8/2002 | Wicker | |
| 7,893,419 | B2 | 2/2011 | Hudgens et al. | |
| 9,281,471 | B2 | 3/2016 | Hu et al. | |
| 10,325,653 | B2 | 6/2019 | Hu et al. | |
| 2006/0289847 | A1 | 12/2006 | Dodge | |
| 2013/0087756 | A1 | 4/2013 | Joseph et al. | |
| 2014/0021439 | A1 * | 1/2014 | Pellizzer | H10B 63/20 257/E21.585 |
| 2020/0287129 | A1 * | 9/2020 | Sarkar | H10N 70/231 |
| 2020/0287133 | A1 | 9/2020 | Sakar et al. | |
| 2020/0295083 | A1 * | 9/2020 | Cheng | H10N 70/826 |
| 2021/0225441 | A1 * | 7/2021 | Gong | H10N 70/231 |

* cited by examiner

*Primary Examiner* — Shih Tsun A Chou
(74) *Attorney, Agent, or Firm* — Samuel A. Waldbaum

(57) ABSTRACT

Techniques for improving switching properties of phase change memory devices by boron surface passivation of the phase change memory material are provided. In one aspect, a phase change memory device includes: one or more phase change memory cells, each having a phase change material between a bottom electrode and a top electrode; and a boron-containing and nitrogen-containing bilayer on sidewalls of the phase change material to protect the phase change material from exposure to oxygen. An ovonic threshold switch can be implemented between the bottom electrode and the top electrode, in series with the phase change material. A method of fabricating the present phase change memory devices is also provided.

13 Claims, 7 Drawing Sheets

800

BORON SURFACE PASSIVATION OF PHASE CHANGE MEMORY MATERIAL

FIELD OF THE INVENTION

The present invention relates to phase change memory devices, and more particularly, to techniques for improving switching properties of phase change memory devices by boron surface passivation of the phase change memory material.

BACKGROUND OF THE INVENTION

A resistive processing unit or RPU stores information based on the resistance of the RPU. For instance, during programming, a SET operation is used to program the RPU to a low-resistance state representing a data value such as a logic '1' or a logic '0'. A subsequent RESET operation is then used to return the RPU to its previous high-resistance state.

A phase change material is a type of material that can be switched from one phase to another. Based on the properties of the different phases, phase change materials are ideal for use as the switching material in RPU-based phase change memory devices. Specifically, phase change materials provide a relatively high resistance when in an amorphous phase, and a relatively low resistance when in a crystalline phase.

During processing, however, exposure of the phase change material to air leads to oxidation. Oxidation of the phase change material can undesirably change its crystallization temperature and composition, both of which can impact the switching behavior of the phase change material.

Accordingly, techniques for protecting the phase change material in phase change memory devices from exposure to oxygen would be desirable.

SUMMARY OF THE INVENTION

The present invention provides techniques for improving switching properties of phase change memory devices by boron surface passivation of the phase change memory material. In one aspect of the invention, a phase change memory device is provided. The phase change memory device includes: one or more phase change memory cells, each having a phase change material between a bottom electrode and a top electrode; and a boron-containing and nitrogen-containing bilayer on sidewalls of the phase change material to protect the phase change material from exposure to oxygen.

In another aspect of the invention, another phase change memory device is provided. The phase change memory device includes: one or more phase change memory cells, each having a phase change material between a bottom electrode and a top electrode; a boron-containing and nitrogen-containing bilayer on sidewalls of the phase change material to protect the phase change material from exposure to oxygen; and an ovonic threshold switch, between the bottom electrode and the top electrode, that is in series with the phase change material.

In yet another aspect of the invention, a method of fabricating a phase change memory device is provided. The method includes: forming a stack of device materials on a substrate, the stack of device materials having a phase change material; patterning the stack of device materials into one or more phase change memory cells; and contacting the phase change memory cells with boron-containing and nitrogen-containing plasmas under conditions sufficient to form a boron-containing and nitrogen-containing bilayer on sidewalls of the phase change material to protect the phase change material from exposure to oxygen.

A more complete understanding of the present invention, as well as further features and advantages of the present invention, will be obtained by reference to the following detailed description and drawings.

DETAILED DESCRIPTION OF PREFERRED EMBODIMENTS

As provided above, the oxidation of exposed phase change memory materials can undesirably lead to changes in its crystallization temperature and composition, both of which impact the switching behavior of the phase change material. Advantageously, the present techniques employ a surface treatment using boron passivation to protect the sidewalls of the phase change memory material from exposure to oxygen. As will be described in detail below, the present boron surface passivation vastly improves the switching properties of the phase change memory material.

Figure 1:
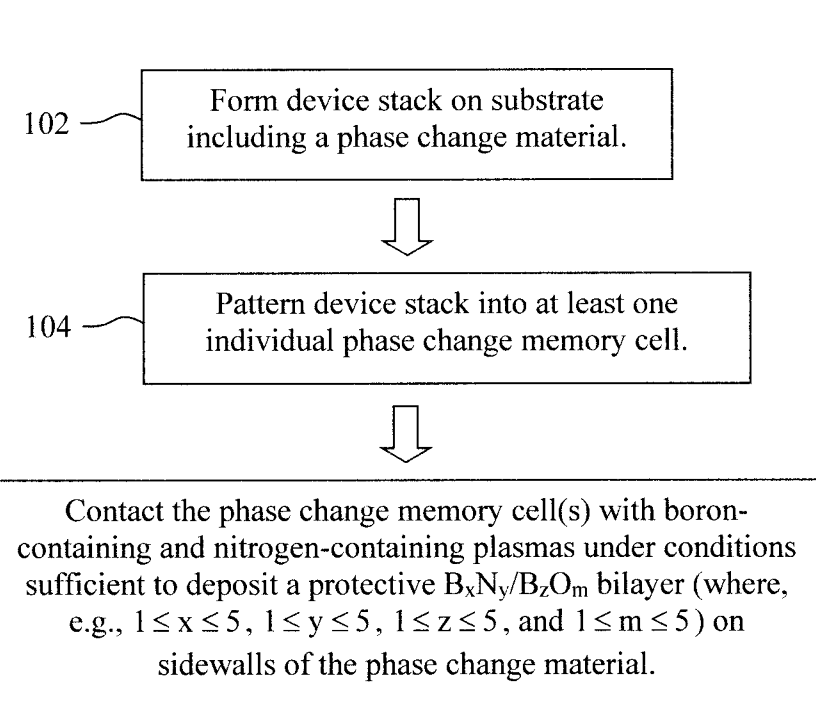
FIG. 1 is a diagram illustrating an exemplary methodology for fabricating a phase change memory device according to an embodiment of the present invention.

Referring to methodology 100 shown in FIG. 1, the present techniques for fabricating a phase change memory device in accordance with the present techniques involve first forming a phase change memory device stack on a substrate (see step 102). The phase change memory device stack includes a phase change material sandwiched between a bottom electrode and a top electrode, with other intervening materials as described in detail below.

According to an exemplary embodiment, the substrate is a bulk semiconductor wafer, such as a bulk silicon (Si), bulk germanium (Ge), bulk silicon germanium (SiGe) and/or bulk III-V semiconductor wafer. Alternatively, the substrate can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, the substrate may already have pre-built structures such as transistors, diodes, capacitors, resistors, interconnects, wiring, etc.

A wide variety of materials can be employed as the phase change material in accordance with the present techniques. In the sense that it can exist in amorphous and crystalline form, almost any material is a phase change material, such as metals, semiconductors or insulators. However, only a small group of materials has the properties that makes them technologically useful phase change materials, with a high on/off resistance ratio, fast switching times and good data retention. Many technologically relevant phase change materials are chalcogenides, i.e., they contain one or more chalcogenide elements. Chalcogenide elements are those elements in Group 16 of the periodic table, e.g., sulfur (S), selenium (Se) and/or tellurium (Te). Thus, according to one exemplary embodiment, the present phase change material is a chalcogenide alloy that includes the chalcogenide element Te, in addition to other elements such as antimony (Sb) and/or germanium (Ge), forming the alloys $Sb_2Te_3$, GeTe, and/or $Ge_2Sb_2Te_5$ (GST 225 or simply GST). However, other technologically relevant materials for use as the present phase change material that are not chalcogenides include, but are not limited to, III-V semiconductor materials (such as gallium antimonide (GaSb)) and/or Ge—Sb based alloys. Furthermore, additional elements such as silver (Ag), indium (In), nitrogen (N), silicon (Si) and/or bismuth (Bi) can be added to any of the above phase change materials to optimize their properties.

As highlighted above, the present phase change material can be switched between two states, a poly-crystalline (or single-crystal) state and an amorphous state. In the poly-crystalline state, each grain of the present phase change material is a perfect crystal and the phase change material is conductive (almost metallic). It is notable, however, that each of the grains is randomly oriented with respect to the other grains resulting in an overall poly-crystalline material. In the amorphous state, there is no order in the material and the phase change material is highly resistive. These two states make phase change materials particularly well-suited for storing data.

In step 104, a lithography and etching process is employed to pattern the phase change memory device stack into at least one individual phase change memory cell. Doing so exposes sidewalls of the phase change material to oxidation. Without further treatment, this oxidation can lead to alterations of the phase change material (such as its crystallization temperature and composition) which can undesirably impact the switching behavior of the phase change material as described above.

However, in order to protect the phase change material from the effects of this oxygen exposure, in step 106 the phase change memory cell(s) is/are next contacted with boron-containing and nitrogen-containing plasmas under conditions (duration, flow rate, etc.) sufficient to form a thin, protective $B_xN_y/B_zO_m$ bilayer (where, e.g., 1≤x≤5, 1≤y≤5, 1≤z≤5, and 1≤m≤5) on, and encapsulating, the sidewalls of the phase change material. This $B_xN_y/B_zO_m$ bilayer protects the sidewalls of the phase change material from air exposure, thereby improving the switching properties of the phase change material. Namely, the boron is an oxygen getter. Thus, exposure of the phase change memory cell(s) to the boron-containing and nitrogen-containing plasmas initially forms a $B_zO_m$ layer on the sidewalls of the phase change material which reduces the phase change material sidewall oxide. A layer of $B_xN_y$ then forms on top of the $B_zO_m$ layer to passivate the surface and protect the sidewalls of the phase change material from air exposure. The combination of the $B_zO_m$ layer and the $B_xN_y$ layer deposited on the sidewalls of the phase change material in step 106 is what is referred to herein as a 'bilayer'.

Preferably, only a thin layer of $B_xN_y/B_zO_m$ is deposited on the sidewalls of the phase change material. For instance, in one exemplary embodiment, the $B_zO_m$ layer has a thickness of from about 2 nanometers (nm) to about 25 nm and ranges therebetween, and similarly the $B_xN_y$ layer has a thickness of from about 2 nm to about 25 nm and ranges therebetween. In that case, the total thickness of the $B_xN_y/B_zO_m$ bilayer is from about 4 nm to about 50 nm and ranges therebetween.

In general, a plasma is a gas in which a significant percentage of the atoms or molecules are ionized. Processes such as plasma-enhanced chemical vapor deposition (PECVD) deposit materials from a gas state to a solid state on a given substrate. According to an exemplary embodiment, the boron-containing plasma contains diborane ($B_2H_6$) gas and the nitrogen-containing plasma contains a combination of nitrogen ($N_2$) gas and hydrogen ($H_2$) gas, $N_2/H_2$ (e.g., $N_2$ 900 standard cubic centimeters per minute (sccm) and $H_2$ 100 sccm), and a process such as PECVD is used to deposit the protective $B_xN_y/B_zO_m$ bilayer on the sidewalls of the phase change material from these gaseous precursors.

Figure 2:
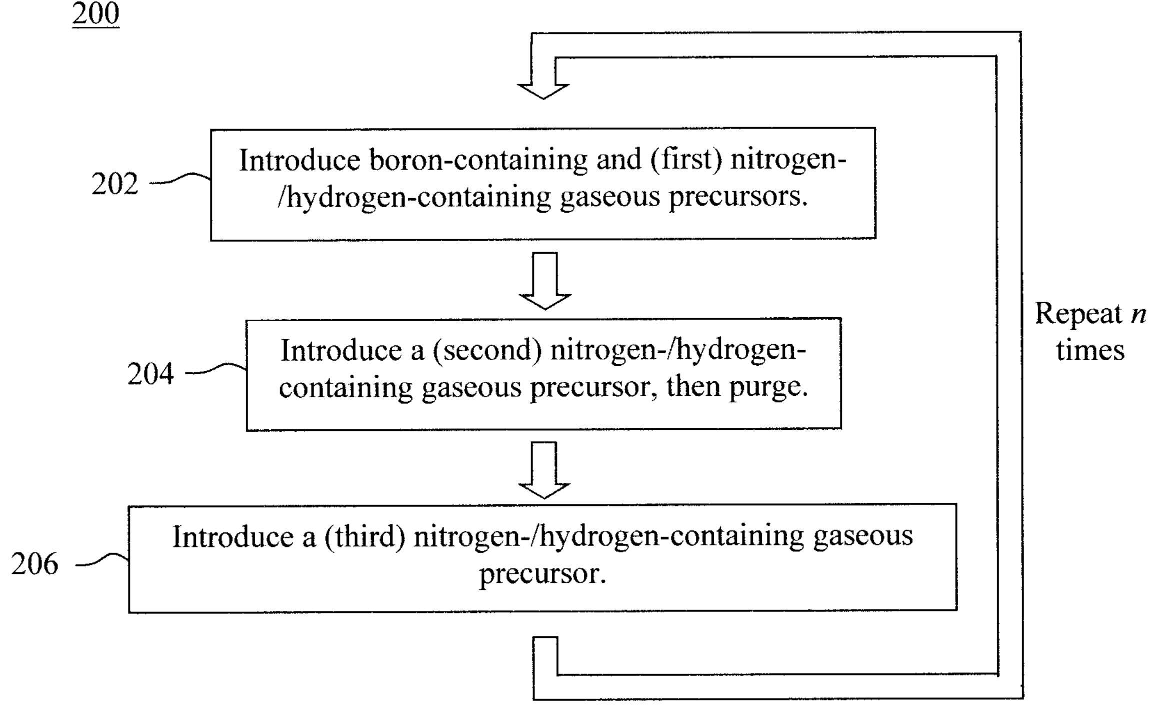
FIG. 2 is a diagram illustrating an exemplary methodology for forming a protective $B_xN_y/B_zO_m$ bilayer on sidewalls of the present phase change memory device material according to an embodiment of the present invention.

In that regard, according to an exemplary embodiment, step 106 for forming the protective $B_xN_y/B_zO_m$ bilayer on the sidewalls of the phase change material is carried out in a PECVD processing chamber whereby a number of (sub) steps is performed to introduce a sequence of boron-containing and/or nitrogen-containing gaseous precursors into the PECVD processing chamber as shown, for example, in methodology 200 of FIG. 2. These gaseous precursors are used to generate the boron-containing and nitrogen-containing plasmas within the PECVD processing chamber.

For instance, the phase change memory cell(s) is/are placed in the PECVD processing chamber and, in step 202, a combination of boron-containing and (first) nitrogen-/hydrogen-containing gaseous precursors, e.g., $B_2H_6+N_2/H_2$, is introduced to the PECVD processing chamber (at a flow rate of $B_2H_6$ from about 500 sccm to about 550 sccm and ranges therebetween, $N_2$ from about 900 sccm to about 950 sccm and ranges therebetween, and $H_2$ from about 100 sccm to about 150 sccm and ranges therebetween) for a duration of from about 2 seconds to about 4 seconds and ranges therebetween. These gaseous precursors are used to generate boron-containing and nitrogen-containing plasmas in the PECVD chamber that are contacted with the phase change memory cell(s) during formation of the $B_xN_y/B_zO_m$ bilayer (where, e.g., 1≤x≤5, 1≤y≤5, 1≤z≤5, and 1≤m≤5) on the sidewalls of the phase change material.

In step 204, a (second) nitrogen-/hydrogen-containing gaseous precursor, e.g., $N_2/H_2$, is then introduced to the PECVD processing chamber (at a flow rate of $N_2$ from about 900 sccm to about 950 sccm and ranges therebetween, and $H_2$ from about 100 sccm to about 150 sccm and ranges therebetween) for a duration of from about 5 seconds to about 7 seconds and ranges therebetween. This gaseous precursor is used to generate a nitrogen-containing plasma in the PECVD chamber that is contacted with the phase change memory cell(s) during formation of the $B_xN_y/B_zO_m$ bilayer (where, e.g., $1 \leq x \leq 5$, $1 \leq y \leq 5$, $1 \leq z \leq 5$, and $1 \leq m \leq 5$) on the sidewalls of the phase change material. Following step 204, the PECVD processing chamber is purged of the gaseous precursors.

In step 206, a (third) nitrogen-/hydrogen-containing gaseous precursor, e.g., $N_2/H_2$, is introduced to the PECVD processing chamber (at a flow rate of $N_2$ from about 900 sccm to about 950 sccm and ranges therebetween, and $H_2$ from about 100 sccm to about 150 sccm and ranges therebetween) for a duration of from about 5 seconds to about 7 seconds and ranges therebetween. This gaseous precursor is used to generate a nitrogen-containing plasma in the PECVD chamber that is contacted with the phase change memory cell(s) during formation of the $B_xN_y/B_zO_m$ bilayer (where, e.g., $1 \leq x \leq 5$, $1 \leq y \leq 5$, $1 \leq z \leq 5$, and $1 \leq m \leq 5$) on the sidewalls of the phase change material.

As shown in FIG. 2, steps 202-206 are repeated n times to build up the $B_xN_y/B_zO_m$ bilayer on the sidewalls of the phase change material. As provided above, the thickness of the $B_xN_y/B_zO_m$ bilayer can be from about 4 nm to about 50 nm and ranges therebetween. According to an exemplary embodiment, this $B_xN_y/B_zO_m$ bilayer thickness is achieved by performing 10 cycles of steps 202-206, i.e., n=10.

Figure 3:
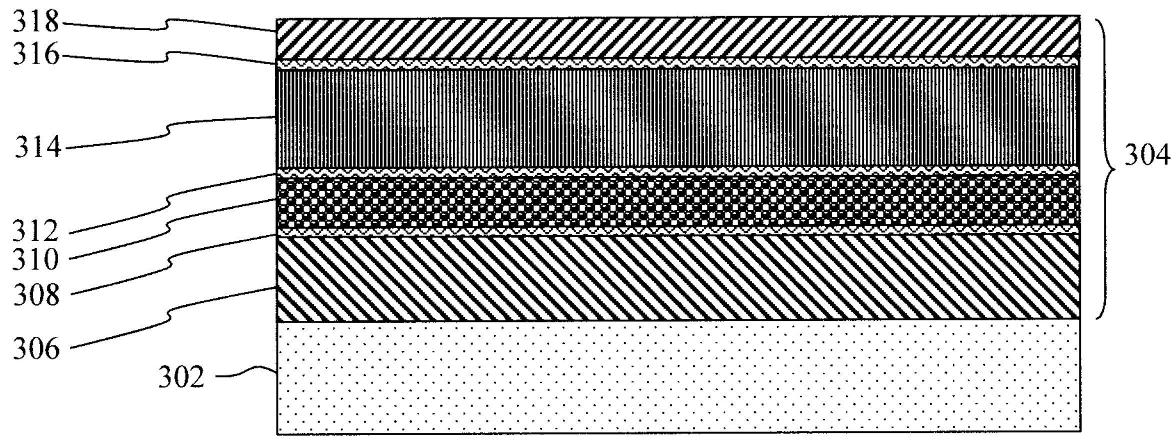
FIG. 3 is a cross-sectional diagram illustrating a phase change memory device stack having been formed on a substrate according to an embodiment of the present invention.
Figure 4:
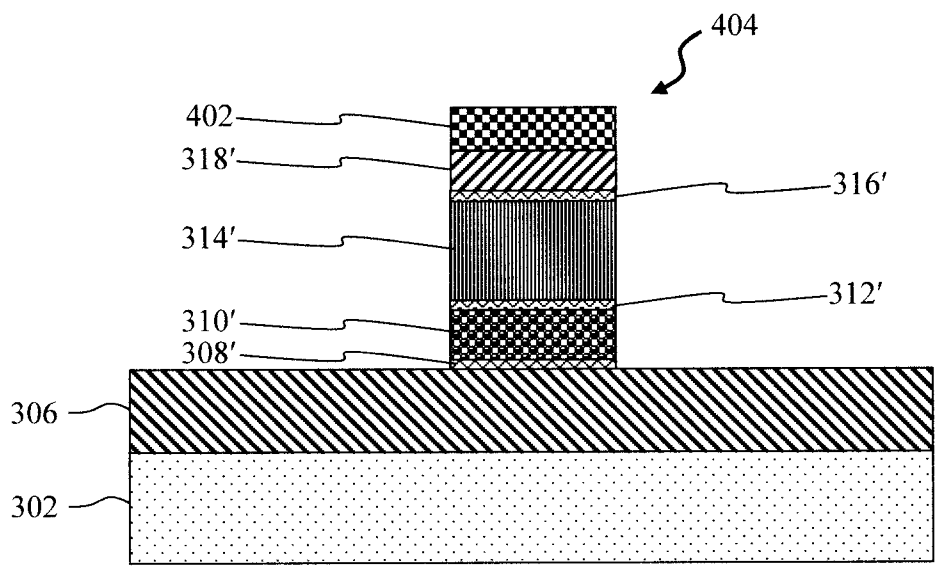
FIG. 4 is a cross-sectional diagram illustrating the phase change memory device stack having been patterned into at least one individual phase change memory cell according to an embodiment of the present invention.
Figure 5:
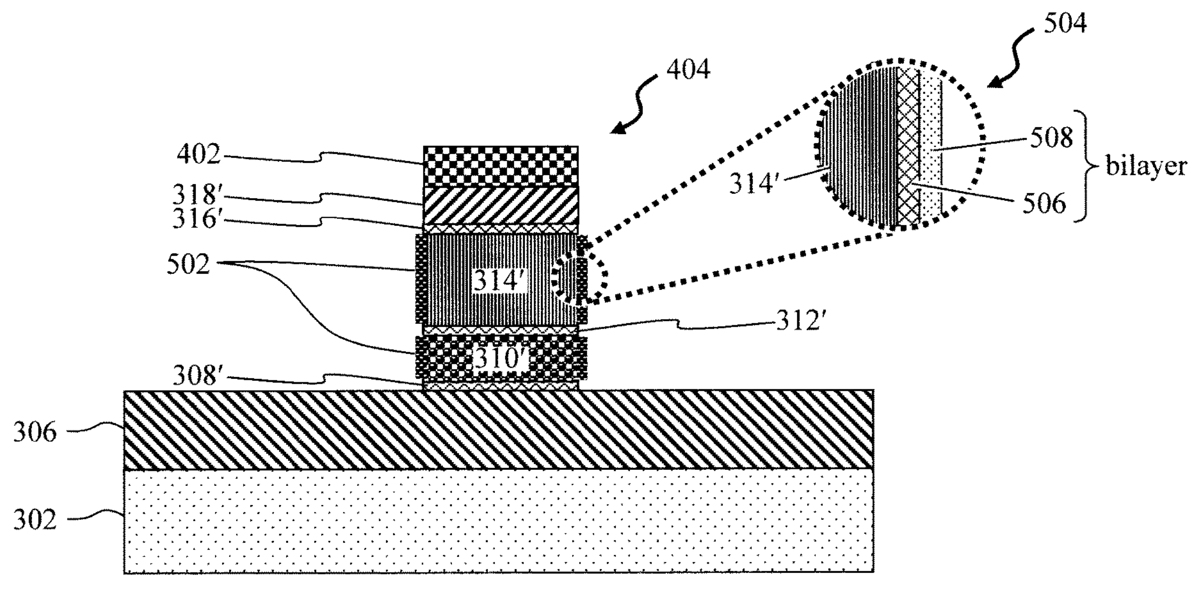
FIG. 5 is a cross-sectional diagram illustrating a boron-containing and nitrogen-containing bilayer (e.g., $B_xN_y/B_zO_m$) having been formed on sidewalls of the phase change memory cell material according to an embodiment of the present invention.

An exemplary implementation of methodology 100 of FIG. 1 and methodology 200 of FIG. 2 to fabricate a phase change memory device in accordance with the present techniques is now described by way of reference to FIGS. 3-5. For instance, as described in conjunction with the description of step 102 of FIG. 1 above, the process begins with the formation of a (phase change memory) device stack on a substrate. See, for example, FIG. 3.

Namely, as shown in FIG. 3, a phase change memory device stack 304 has been formed on a substrate 302. As provided above, substrate 302 can be a bulk semiconductor wafer, such as a bulk Si, bulk Ge, bulk SiGe and/or bulk III-V semiconductor wafer, or an SOI wafer with an SOI layer formed form a semiconductor material(s) such as Si, Ge, SiGe and/or a III-V semiconductor. Further, substrate 302 may already have pre-built structures such as transistors, diodes, capacitors, resistors, interconnects, wiring, etc.

According to an exemplary embodiment, phase change memory device stack 304 includes a bottom electrode 306 disposed on the substrate 302, a (first) buffer layer 308 disposed on the bottom electrode 306, an ovonic threshold switch (OTS) 310 disposed on the buffer layer 308, a (second) buffer layer 312 disposed on the OTS 310, a phase change material 314 disposed on the buffer layer 312, a (third) buffer layer 316 disposed on the phase change material 314, and a top electrode 318 disposed on the buffer layer 316.

It is notable that the configuration of phase change memory device stack 304 shown in FIG. 3 is merely an example that is being provided to illustrate the present techniques for forming the protective $B_xN_y/B_zO_m$ bilayer on the sidewalls of the phase change material 314. Thus, it is to be understood that the techniques described herein are more generally applicable to any phase change memory having a phase change material with exposed sidewalls, and should not be construed as being limited to any particular phase change memory configuration(s).

Suitable materials for the bottom electrode 306 include, but are not limited to, metals such as titanium (Ti), tantalum (Ta), cobalt (Co), ruthenium (Ru), tungsten (W) and/or aluminum (Al), metal nitrides such as titanium nitride (TiN), tantalum nitride (TaN), tungsten nitride (WN) and/or aluminum nitride (AlN) and/or a doped semiconductor, which can be deposited onto the substrate 302 using a process such as chemical vapor deposition (CVD), atomic layer deposition (ALD), physical vapor deposition (PVD), sputtering, evaporation, electrochemical plating, etc. According to an exemplary embodiment, the bottom electrode 306 has a thickness of from about 10 nm to about 50 nm and ranges therebetween.

Buffer layer 308 provides an etch stop for subsequent patterning of the phase change memory device stack 304 and serves to prevent intermixing of the phase change memory device stack 304 materials. Suitable buffer layer 308 materials include, but are not limited to, carbon (C), silicon carbide (SiC), silicon (Si), tantalum (Ta), tantalum nitride (TaN), tantalum carbide (TaC), tungsten (W), tungsten nitride (WN), tungsten carbide (WC), titanium (Ti), titanium nitride (TiN) and/or titanium carbide (TiC), which can be deposited using a process such as CVD, ALD or PVD. According to an exemplary embodiment, buffer layer 308 has a thickness of from about 10 nm to about 30 nm and ranges therebetween. Further, while shown as a single layer, buffer layer 308 can optionally be composed of multiple layers, each one containing at least one of the above-provided materials.

As will be described in detail below, the present phase change memory devices can include an array of phase change memory cells arranged in a cross-point configuration between a plurality of first/second metal lines positioned below/above the phase change memory cells. With such a cross-point array, one of the phase change memory cells will be present at each intersection of the first and second metal lines. In that regard, OTS 310 aids in the selection of an individual one of the phase change memory cells in the array. Namely, OTS 310 is placed in series with the phase change material 314 and acts as a switch that, with an applied current, switches from a highly resistive state to a conductive state. When the current is removed, OTS 310 returns to its highly resistive state.

Suitable materials for the OTS 310 include, but are not limited to, arsenic selenium germanium silicon (AsSeGeSi), arsenic selenium germanium silicon carbide (AsSeGeSiC), arsenic selenium germanium silicon nitride (AsSeGeSiN), arsenic selenium germanium silicon tellurium (AsSeGeSiTe), arsenic selenium germanium silicon tellurium sulfide (AsSeGeSiTeS), arsenic tellurium germanium silicon (AsTeGeSi) and/or arsenic tellurium germanium silicon nitride (AsTeGeSiN), which can be deposited using a process such as CVD, ALD or PVD. According to an exemplary embodiment, OTS 310 has a thickness of less than or equal to about 50 nm, e.g., from about 10 nm to about 45 nm and ranges therebetween.

Like buffer layer 308, buffer layer 312 provides an etch stop and serves to prevent intermixing of the phase change memory device stack 304 materials. Suitable buffer layer 312 materials include, but are not limited to, C, SiC, Si, Ta, TaN, TaC, W, WN, WC, Ti, TiN and/or TiC, which can be deposited using a process such as CVD, ALD or PVD. According to an exemplary embodiment, buffer layer 312 has a thickness of from about 10 nm to about 30 nm and ranges therebetween. Further, while shown as a single layer, buffer layer 312 can optionally be composed of multiple layers, each one containing at least one of the above-provided materials.

As provided above, a wide variety of materials can be employed as phase change material 314 in accordance with the present techniques. For instance, according to an exemplary embodiment, phase change material 314 is a chalcogenide alloy that includes the chalcogenide element Te, in addition to other elements such as Sb and/or Ge, e.g., $Sb_2Te_3$, GeTe, and/or $Ge_2Sb_2Te_5$. Alternatively, embodiments are also contemplated herein where phase change material 314 is a non-chalcogenides material such as, but not limited to, GaSb and/or Ge—Sb based alloys. Furthermore, additional elements such as Ag, In, N, Si and/or Bi can be added to any of the above phase change materials to optimize their properties.

In one exemplary embodiment, the phase change material 314 is deposited using a process such as PVD or CVD. Of course, the specific targets (PVD) or precursors (CVD) for the deposition process depend on the particular phase change material being formed. For example, when physical vapor deposition (PVD) is used to deposit $Ge_2Sb_2Te_5$ the most common source is a $Ge_2Sb_2Te_5$ target. Alternatively, separate elemental Ge, Sb and Te targets can also be used by adjusting the flux from each target to obtain the desired composition. In another exemplary embodiment, molecular beam epitaxy is used to deposit $Ge_2Sb_2Te_5$. When molecular beam epitaxy is used, the sources may be individual Knudsen effusion cells. Namely, each cell contains one of the alloy elements (Ge, Sb or Te), and the flux of each element is controlled by the effusion cell temperature. In one exemplary implementation, the deposition of phase change material 314 is performed at a high substrate temperature, for example, at a substrate temperature of from about 150 degrees Celsius (° C.) to about 300° C. and ranges therebetween. For instance, with $Ge_2Sb_2Te_5$ the preferred substrate temperature range is from about 175° C. to about 200° C. and ranges therebetween to produce the crystalline form of $Ge_2Sb_2Te_5$. By contrast, a room temperature deposition would generally yield an amorphous material when $Ge_2Sb_2Te_5$ is deposited. However, some phase change materials such as $Sb_2Te_3$ would be crystalline even at deposition temperatures below 100° C. According to an exemplary embodiment, the phase change material 314 has a thickness of from about 5 nm to about 50 nm and ranges therebetween.

Like buffer layers 308 and 312 above, buffer layer 316 provides an etch stop and serves to prevent intermixing of the phase change memory device stack 304 materials. Suitable buffer layer 316 materials include, but are not limited to, C, SiC, Si, Ta, TaN, TaC, W, WN, WC, Ti, TiN and/or TiC, which can be deposited using a process such as CVD, ALD or PVD. According to an exemplary embodiment, buffer layer 316 has a thickness of from about 10 nm to about 30 nm and ranges therebetween. Further, while shown as a single layer, buffer layer 316 can optionally be composed of multiple layers, each one containing at least one of the above-provided materials.

Suitable materials for the top electrode 318 include, but are not limited to, metals such as Ti, Ta, Co, Ru, W and/or Al, metal nitrides such as TiN, TaN, WN and/or AlN, and/or a doped semiconductor, which can be deposited using a process such as CVD, ALD, PVD, sputtering, evaporation, electrochemical plating, etc. According to an exemplary embodiment, the top electrode 318 has a thickness of from about 5 nm to about 20 nm and ranges therebetween.

Standard lithography and etching techniques are then used to pattern the phase change memory device stack 304 into at least one individual phase change memory cell 404. See FIG. 4. With standard lithography and etching techniques, a lithographic stack (not shown), e.g., photoresist/anti-reflective coating/organic planarizing layer, is used to pattern a hardmask 402 with the footprint and location of the phase change memory cell(s) 404 to be patterned in the phase change memory device stack 304. Suitable hardmask 402 materials include, but are not limited to, silicon nitride (SiN), silicon dioxide ($SiO_2$), titanium nitride (TiN) and/or silicon oxynitride (SiON). An etch is then performed to transfer the pattern from hardmask 402 to the underlying phase change memory device stack 304. Alternatively, hardmask 402 can be formed by other suitable techniques, including but not limited to, sidewall image transfer (SIT), self-aligned double patterning (SADP), self-aligned quadruple patterning (SAQP), and other self-aligned multiple patterning (SAMP). A directional (i.e., anisotropic) etching process such as reactive ion etching can be employed for the stack etch.

As shown in FIG. 4, the phase change memory device stack 304 is patterned down to the bottom electrode 306. Thus, each phase change memory cell 404 formed includes the bottom electrode 306, a patterned portion of the buffer layer 308 (given reference numeral 308'), a patterned portion of the OTS 310 (given reference numeral 310'), a patterned portion of the buffer layer 312 (given reference numeral 312'), a patterned portion of the phase change material 314 (given reference numeral 314'), a patterned portion of the buffer layer 316 (give reference numeral 316'), and a patterned portion of the top electrode 318 (given reference numeral 318'). It is notable that the patterning of phase change memory device stack 304 can involve a series of reactive ion etching steps for which buffer layers 308, 312 and/or 316 can serve as etch stops, as highlighted above.

Patterning of the phase change memory device stack 304 leaves the sidewalls of the phase change material 314' exposed to oxygen. As described in detail above, oxidation of the phase change material can undesirably lead to changes in its crystallization temperature and composition, both of which impact the switching behavior of the phase change material. Thus, as shown in FIG. 5, the techniques described in conjunction with the description of methodology 100 of FIG. 1 and methodology 200 of FIG. 2 are employed to form a boron-containing and nitrogen-containing bilayer 502 on the sidewalls of the phase change material 314' that advantageously serves to encapsulate and protect the phase change material from exposure to oxygen. By this process the boron-containing and nitrogen-containing bilayer 502 can also form on the sidewalls of the OTS 310', as shown in FIG. 5.

Referring to magnified view 504, according to an exemplary embodiment, the boron-containing and nitrogen-containing bilayer 502 includes a $B_zO_m$ layer 506 (where, e.g., $1 \le z \le 5$ and $1 \le m \le 5$) disposed on the sidewalls of the phase change material 314', and a $B_xN_y$ layer 508 (where, e.g., $1 \le x \le 5$ and $1 \le y \le 5$) disposed on the $B_zO_m$ layer 506. The boron-containing and nitrogen-containing bilayer 502 is thin. For example, in one embodiment, the $B_zO_m$ 506 layer has a thickness of from about 2 nm to about 25 nm and ranges therebetween, and the $B_xN_y$ layer 508 has a thickness of from about 2 nm to about 25 nm and ranges therebetween. In that case, the total thickness of the $B_xN_y/B_zO_m$, bilayer is from about 4 nm to about 50 nm and ranges therebetween.

Namely, as provided above, boron-containing and nitrogen-containing bilayer 502 can be formed, in accordance with the present techniques, by contacting the phase change memory cell(s) 404 with boron-containing and nitrogen-containing plasmas under conditions (e.g., duration, flow rate, etc.) sufficient to form the boron-containing and nitrogen-containing bilayer 502 (e.g., $B_xN_y/B_zO_m$) on the sidewalls of the phase change material 314'. Namely, boron is an oxygen getter. Thus, exposure of the phase change memory cell(s) 404 to the boron-containing and nitrogen-containing plasmas initially form a $B_zO_m$ layer on the sidewalls of the phase change material which reduces the phase change material sidewall oxide. A layer of $B_xN_y$ then forms on top of the $B_zO_m$ layer to passivate the surface and protect the sidewalls of the phase change material from air exposure.

For instance, as described above, deposition of the boron-containing and nitrogen-containing bilayer 502 (e.g., $B_xN_y/B_zO_m$) can be carried out in a PECVD processing chamber with a sequence of boron-containing and/or nitrogen-containing gaseous precursors to generate the respective plasmas within the PECVD processing chamber. One such exemplary sequence is detailed in methodology 200 of FIG. 2, above. With that sequence, a 3-step process is performed using $B_2H_6$+$N_2/H_2$, $N_2/H_2$ (and purge), and $N_2/H_2$ plasmas, which is then repeated for multiple cycles.

Specifically, using the sequence of methodology 200 as a non-limiting, illustrative example, the (patterned) phase change memory cell(s) 404 are placed into a PECVD processing chamber. The boron-containing and nitrogen-containing bilayer 502 (e.g., $B_xN_y/B_zO_m$) is then formed on the sidewalls of the phase change material 314' by introducing a combination of boron-containing and (first) nitrogen-/hydrogen-containing gaseous precursors, e.g., $B_2H_6$+$N_2/H_2$, to the PECVD processing chamber for a duration of from about 2 seconds to about 4 seconds and ranges therebetween. According to an exemplary embodiment, a flow rate of the $B_2H_6$ gaseous precursor is from about 500 sccm to about 550 sccm and ranges therebetween, a flow rate of the $N_2$ gaseous precursor is from about 900 sccm to about 950 sccm and ranges therebetween, and a flow rate of the $H_2$ gaseous precursor is from about 100 sccm to about 150 sccm and ranges therebetween. These gaseous precursors generate boron-containing and nitrogen-containing plasmas in the PECVD chamber that are contacted with the phase change memory cell(s) 404.

Next, a (second) nitrogen-/hydrogen-containing gaseous precursor, e.g., $N_2/H_2$, is then introduced to the PECVD processing chamber for a duration of from about 5 seconds to about 7 seconds and ranges therebetween, after which the PECVD processing chamber is purged of the gaseous precursors. According to an exemplary embodiment, a flow rate of the $N_2$ gaseous precursor is from about 900 sccm to about 950 sccm and ranges therebetween, and a flow rate of the $H_2$ gaseous precursor is from about 100 sccm to about 150 sccm and ranges therebetween. This gaseous precursor is used to generate a nitrogen-containing plasma in the PECVD chamber that is contacted with the phase change memory cell(s) 404.

Following the purging of the PECVD processing chamber, another (third) nitrogen-/hydrogen-containing gaseous precursor, e.g., $N_2/H_2$, is introduced to the PECVD processing chamber for a duration of from about 5 seconds to about 7 seconds and ranges therebetween. According to an exemplary embodiment, a flow rate of the $N_2$ gaseous precursor is from about 900 sccm to about 950 sccm and ranges therebetween, and a flow rate of the $H_2$ gaseous precursor is from about 100 sccm to about 150 sccm and ranges therebetween. This gaseous precursor is used to generate a nitrogen-containing plasma in the PECVD chamber that is contacted with the phase change memory cell(s) 404. These 3 steps are then preferably repeated (e.g., 10 times) to build up the $B_xN_y/B_zO_m$ bilayer on the sidewalls of the phase change material 314'. Without being bound by any theory in particular, it is thought that by depositing $B_xN_y$ layer by layer, the first few $B_xN_y$ will form a rich oxygen containing film (i.e., $B_zO_m$) due to the trapping of oxygen by boron. Once this oxygen-rich layer is created, the remainder of the film will grow as $B_xN_y$, thereby forming the present $B_xN_y/B_zO_m$ bilayer.

As will be described in detail below, forming the present boron-containing and nitrogen-containing bilayer 502 on the sidewalls of the phase change material 314' vastly improves its switching properties, as compared to untreated samples. For instance, improved switching properties include switching speeds that are significantly greater than the untreated samples.

From FIG. 5 it can be seen that the present phase change memory cell 404 structure includes the phase change material 314' between the bottom electrode 306 and the top electrode 318'. The sidewalls of the phase change material 314' are protected by the boron-containing and nitrogen-containing bilayer 502. Also present between the bottom electrode 306 and the top electrode 318' is the OTS 310' in series with the phase change material 314'. The buffer layers 308', 312' and 316' are present below the OTS 310', between the OTS 310' and the phase change material 314', and above the phase change material 314', respectively.

Figure 6:
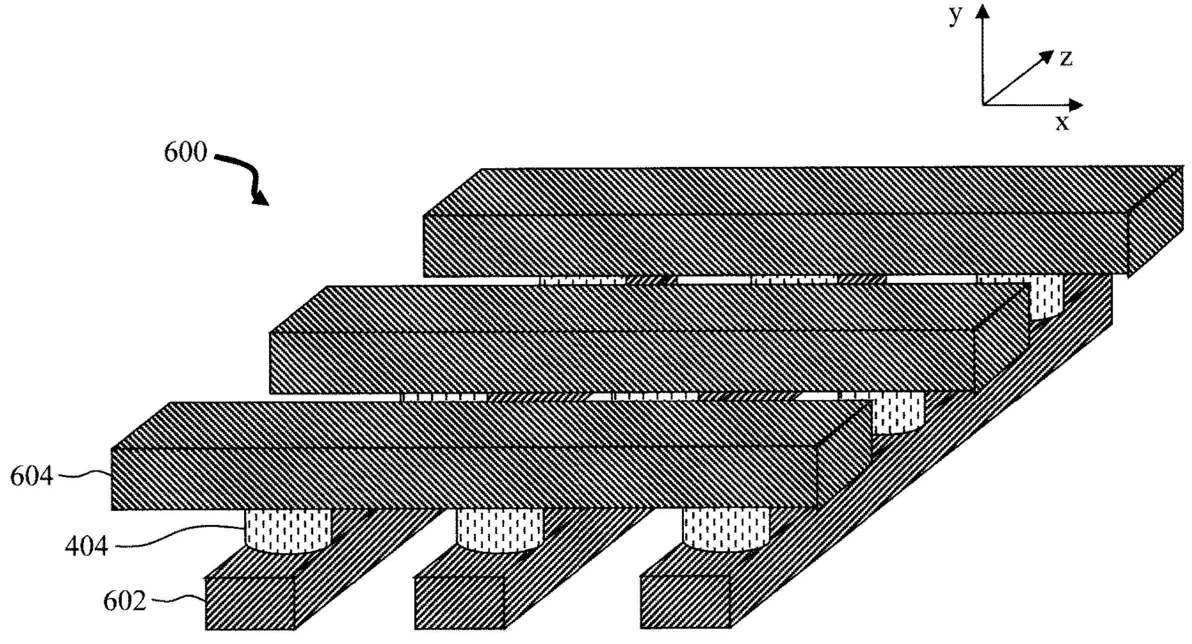
FIG. 6 is a diagram illustrating an exemplary configuration of the present phase change memory device as a cross-point array of phase change memory cells according to an embodiment of the present invention.

As highlighted above, one configuration of the present phase change memory device contemplated herein is as a cross-point array of the phase change memory cells 404. See, for example, FIG. 6. As shown in FIG. 6, an exemplary cross-point array 600 includes a plurality of first metal lines 602 oriented orthogonal to a plurality of second metal lines 604. Phase change memory cells 404 are located between the first metal lines 602 and the second metal lines 604. To look at it another way, the first metal lines 602 are present below phase change memory cells 404 and the second metal lines 604 are present above phase change memory cells 404. Further, the array of phase change memory cells 404 is arranged such that one of the phase change memory cells 404 is present at the intersection of each given first metal line 602 and second metal lines 604. Thus, each of the phase change memory cells 404 can be individually accessed via the respective first and second metal lines 602 and 604. While not explicitly shown in FIG. 6, it is to be understood that each of the phase change memory cells 404 shown therein is configured as described above, and includes a protective boron-containing and nitrogen-containing bilayer 502 on the sidewalls of the phase change material 314', an OTS 310' in series with the phase change material 314', buffer layers 308', 312' and 316' below the OTS 310', between the OTS 310' and the phase change material 314', and above the phase change material 314', respectively, etc.

Figure 7A:
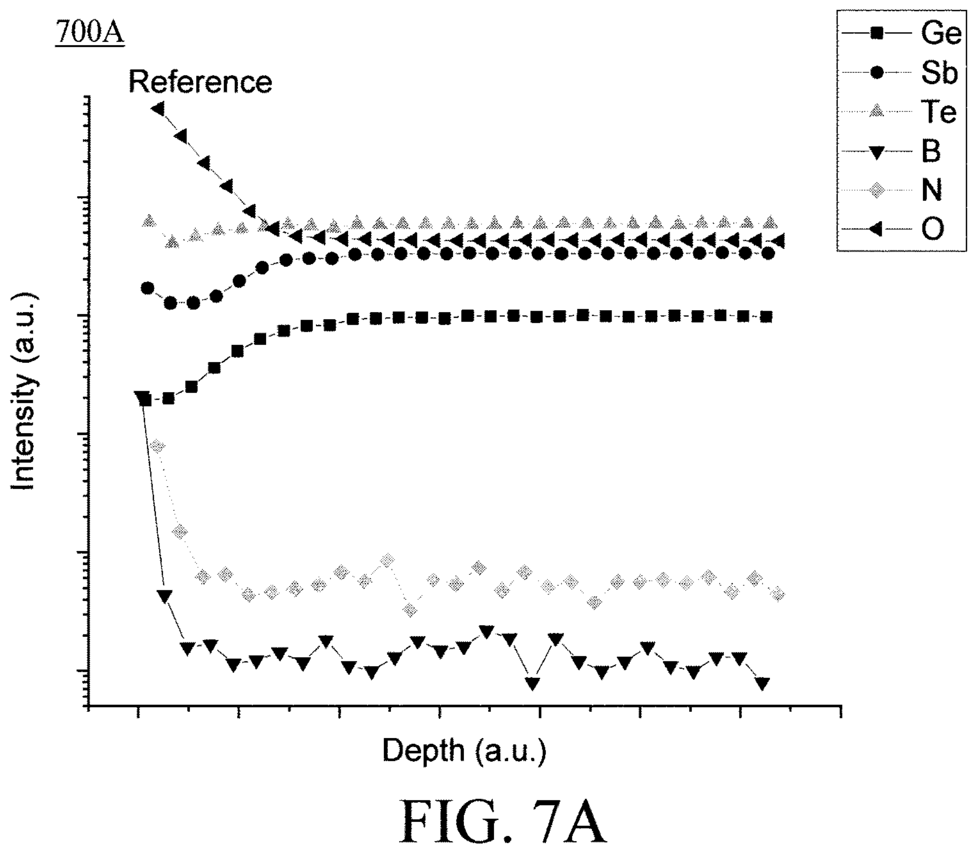
FIG. 7A is a plot of secondary ion mass spectroscopy (SIMS) data that shows elemental depth profiling of a sample phase change memory material (GST) before treatment, as compared to FIG. 7B which is a plot of SIMS data that shows elemental depth profiling of the sample phase change memory material (GST) after the present boron-containing and nitrogen-containing plasma treatment to form the $B_xN_y/B_zO_m$ bilayer on the sidewalls of the sample phase change memory material.

The present techniques are now further described by way of reference to the following non-limiting examples. For instance, plot 700A in FIG. 7A provides secondary ion mass spectroscopy (SIMS) data that show elemental (germanium (Ge), antimony (Sb), tellurium (Te), boron (B), nitrogen (N) and oxygen (O)) depth profiling of a sample phase change memory material (GST) before treatment (labeled "Reference"), as compared to plot 700B in FIG. 7B which provides SIMS data that show elemental (germanium (Ge), antimony (Sb), tellurium (Te), boron (B), nitrogen (N) and oxygen (O)) depth profiling of the sample phase change memory material (GST) after the present boron-containing and nitrogen-containing plasma treatment to form the boron-containing and nitrogen-containing bilayer on the sidewalls of the sample phase change memory material (labeled "BN treated"). Plots 700A and 700B are log scale graphs.

Figure 7B:
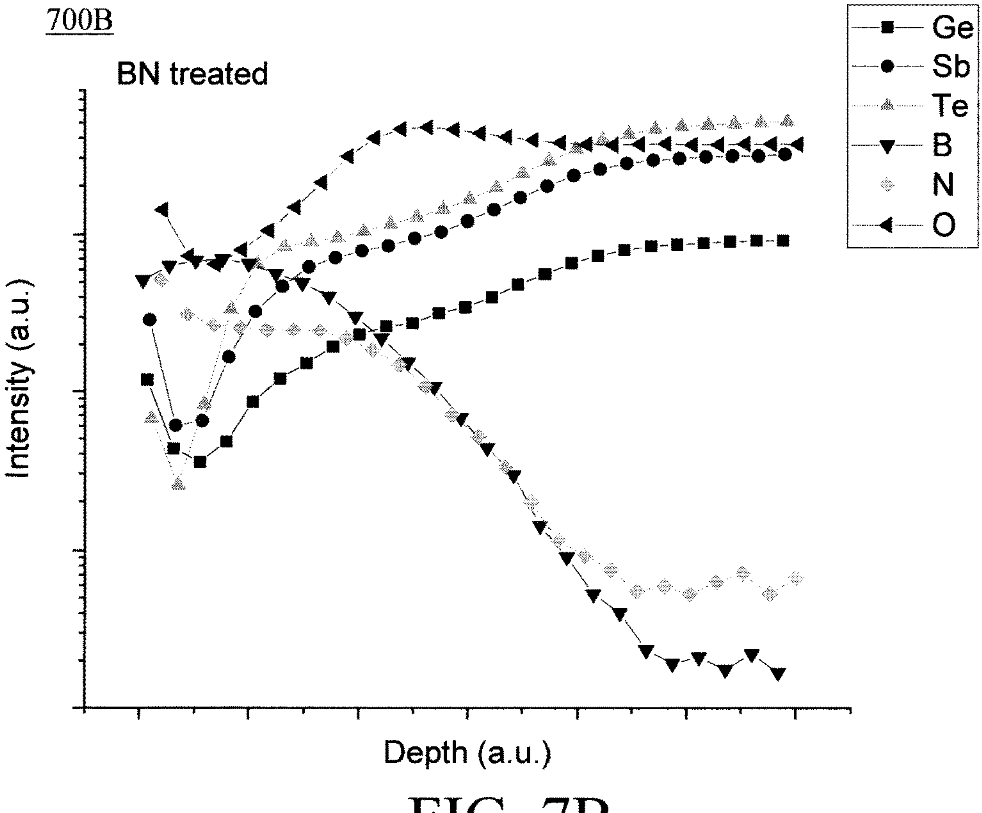

Notably, by comparing FIG. 7A (before treatment) and FIG. 7B (after treatment), it can be seen that the oxygen profile differs for the untreated versus treated samples. Namely, in the Reference (untreated) plot 700A the oxygen profile goes up closer to the surface—likely from oxidation of the phase change memory material, whereas in the BN treated plot 700B, the oxygen profile drops at the near surface (or sidewall) region, forming a barrier for oxygen.

Figure 8:
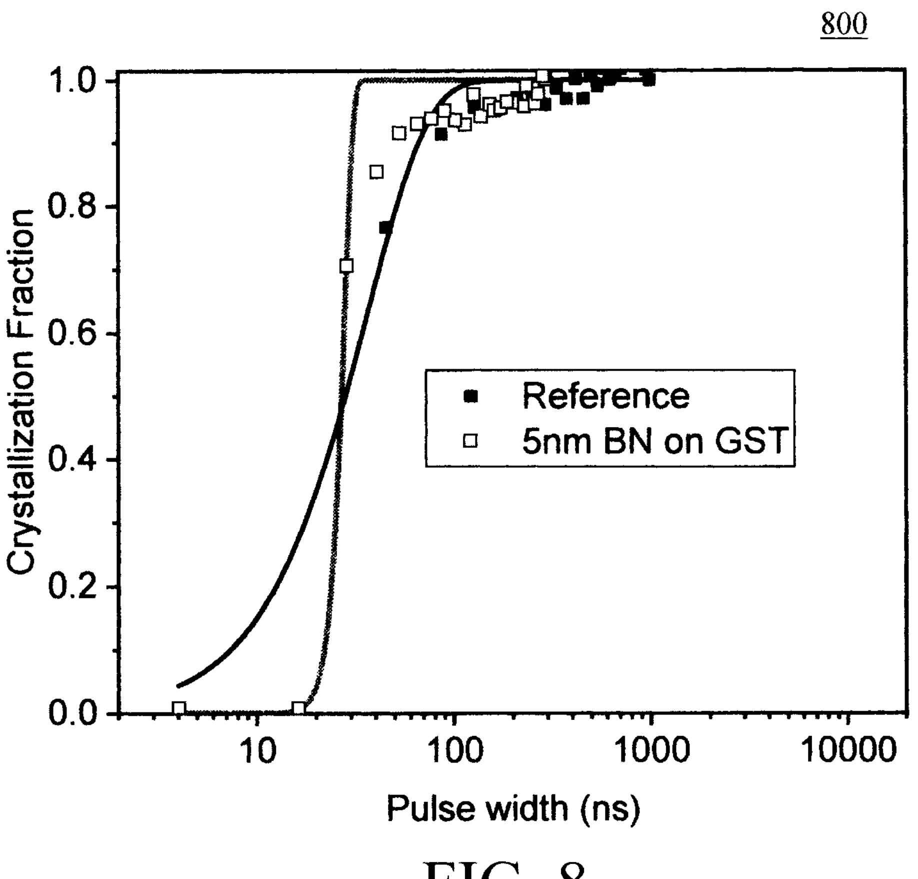
FIG. 8 is a diagram illustrating enhancements in switching speed that are achieved using the present $B_xN_y/B_zO_m$ protective bilayer on the sidewalls of the phase change memory device material according to an embodiment of the present invention.

FIG. 8 is a plot 800 illustrating enhancements in switching speed that are achieved using the present $B_xN_y/B_zO_m$ protective bilayer on the sidewalls of the phase change memory device material. Specifically, plot 800 compares the switching speed (based on crystallization fraction and pulse width) of a reference phase change memory cell with an untreated $Ge_2Sb_2Te_5$ (GST) phase change material—no protective bilayer (labeled "Reference") and another phase change memory cell having a 5 nm $B_xN_y/B_zO_m$ protective bilayer on the sidewalls of the GST phase change material (labeled "5 nm BN on GST"). As shown in plot 800, the sample having the $B_xN_y/B_zO_m$ protective bilayer exhibited a significantly faster switching speed than the untreated reference sample.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A phase change memory device, comprising:

one or more phase change memory cells, each comprising a phase change material between a bottom electrode and a top electrode; and a boron-containing and nitrogen-containing bilayer on sidewalls of the phase change material to protect the phase change material from exposure to oxygen, wherein the boron-containing and nitrogen-containing bilayer includes a boron-oxide layer and a boron-nitride layer.

2. The phase change memory device of claim 1, wherein the boron-containing and nitrogen-containing bilayer comprises:

a $B_zO_m$ layer disposed on the phase change material, wherein $1 \leq z \leq 5$ and $1 \leq m \leq 5$; and a $B_xN_y$ layer disposed on the $B_zO_m$ layer, wherein $1 \leq x \leq 5$ and $1 \leq y \leq 5$.

3. The phase change memory device of claim 2, wherein the $B_zO_m$ layer has a thickness of from about 2 nm to about 25 nm, and wherein the $B_xN_y$ layer has a thickness of from about 2 nm to about 25 nm.

4. The phase change memory device of claim 1, wherein the phase change material is selected from the group consisting of: $Sb_2Te_3$, GeTe, $Ge_2Sb_2Te_5$, GaSb, Ge—Sb, and combinations thereof.

5. The phase change memory device of claim 1, wherein the phase change memory cells are arranged in a cross-point array.

6. A phase change memory device, comprising:

one or more phase change memory cells, each comprising a phase change material between a bottom electrode and a top electrode;

a boron-containing and nitrogen-containing bilayer on sidewalls of the phase change material to protect the phase change material from exposure to oxygen, wherein the boron-containing and nitrogen-containing bilayer includes a boron-oxide layer and a boron-nitride layer; and an ovonic threshold switch, between the bottom electrode and the top electrode, that is in series with the phase change material.

7. The phase change memory device of claim 6, wherein the boron-containing and nitrogen-containing bilayer comprises:

a $B_zO_m$ layer disposed on the phase change material, wherein $1 \leq z \leq 5$ and $1 \leq m \leq 5$; and a $B_xN_y$ layer disposed on the $B_zO_m$ layer, wherein $1 \leq x \leq 5$ and $1 \leq y \leq 5$.

8. The phase change memory device of claim 7, wherein the $B_zO_m$ layer has a thickness of from about 2 nm to about 25 nm, and wherein the $B_xN_y$ layer has a thickness of from about 2 nm to about 25 nm.

9. The phase change memory device of claim 6, wherein the phase change material is selected from the group consisting of: $Sb_2Te_3$, GeTe, $Ge_2Sb_2Te_5$, GaSb, Ge—Sb, and combinations thereof.

10. The phase change memory device of claim 6, wherein the ovonic threshold switch comprises a material selected from the group consisting of: AsSeGeSi, AsSeGeSiC, AsSeGeSiN, AsSeGeSiTe, AsSeGeSiTeS, AsTeGeSi, AsTeGeSiN and combinations thereof.

11. The phase change memory device of claim 6, further comprising:

a first buffer layer below the ovonic threshold switch;

a second buffer layer between the ovonic threshold switch and the phase change material; and a third buffer layer above the phase change material.

12. The phase change memory device of claim 11, wherein the first buffer layer, the second buffer layer, and the third buffer layer each comprises a material selected from the group consisting of: C, SiC, Si, Ta, TaN, TaC, W, WN, WC, Ti, TiN, TiC and combinations thereof.

13. The phase change memory device of claim 11, wherein the phase change memory cells are arranged in a cross-point array.

* * * * *